(12) United States Patent  
Parsapour

(10) Patent No.: US 9,431,622 B2  
(45) Date of Patent: Aug. 30, 2016

(54) QUANTUM DOT OPTOELECTRONIC DEVICE AND METHODS THERFOR

(75) Inventor: Farzad Parsapour, Bartlett, TN (US)

(73) Assignee: Brother International Corporation, Bridgewater, NJ (US)

( * ) Notice: Subject to any disclaimer, the term of this patent is extended or adjusted under 35 U.S.C. 154(b) by 25 days.

(21) Appl. No.: 13/190,884

(22) Filed: Jul. 26, 2011

(65) Prior Publication Data

US 2013/0026445 A1  Jan. 31, 2013

(51) Int. Cl.
| | |
|---|---|
| *B05D 5/12* | (2006.01) |
| *H01L 29/08* | (2006.01) |
| *H01L 51/42* | (2006.01) |
| *H01L 31/0352* | (2006.01) |
| *H01L 51/00* | (2006.01) |

(52) U.S. Cl.
CPC ...... *H01L 51/426* (2013.01); *H01L 31/035218* (2013.01); *H01L 51/0037* (2013.01); *H01L 2251/308* (2013.01); *Y02E 10/549* (2013.01)

(58) Field of Classification Search
CPC ........ B82Y 20/00; B82Y 30/00; B82Y 10/00; B82Y 40/00; H01L 51/426; H01L 51/502; H01L 2251/5369; Y02E 10/549; B32B 2551/00; C08J 5/005; G02B 6/0068; G02B 6/0073; H05B 33/22; Y10S 977/773; Y10S 977/774; Y10S 977/783
USPC .......... 257/12, 431, 40, 66, 500, 602, 13, 21, 257/15, 314, 88, E29.071, 14, E21.09, 257/E21.108, E21.126, E21.423, E29.168, 257/E29.309, E31.032, E33.008, E33.011, 257/E21.089, E29.072, E31.033, E25.032, 257/E29.005, E31.054, E31.124, E51.026; 977/774, 734, 788, 824, 834, 932, 948; 438/22, 34, 46, 494, 763, 98, 478, 104, 438/73, 94, 99
See application file for complete search history.

(56) References Cited

U.S. PATENT DOCUMENTS

| | | | |
|---|---|---|---|
| 5,889,288 | A | 3/1999 | Futatsugi |
| 5,923,046 | A | 7/1999 | Tezuka et al. |
| 5,963,571 | A | 10/1999 | Wingreen |
| 6,239,449 | B1 | 5/2001 | Fafard et al. |
| 6,281,519 | B1 | 8/2001 | Sugiyama et al. |
| 7,282,732 | B2 | 10/2007 | Gray et al. |
| 7,358,525 | B2 | 4/2008 | Lee |
| 7,791,157 | B2 | 9/2010 | Cho et al. |
| 7,829,880 | B2 | 11/2010 | Ebe et al. |

(Continued)

OTHER PUBLICATIONS

*IV-VI Nanocrystal-polymer solar cells* Karolina P. Fritz, Serap Guenes et al. Journal of Photochemistry and Photobiology A-chemistry—J Photochem Photobiol A-Chem, vol. 195, No. 1, pp. 39-46, 2008.

(Continued)

*Primary Examiner* — Su C Kim  
*Assistant Examiner* — Junaiden Mirsalahuddin  
(74) *Attorney, Agent, or Firm* — Frommer Lawrence & Haug LLP

(57) ABSTRACT

An optoelectronic device and method for fabricating optoelectronic device, comprising: forming a quantum dot layer on a substrate including at least one electronically conductive layer, including a plurality of quantum dots which have organic capping layers; and removing organic capping layers from the quantum dots of the quantum dot layer by physically treating the quantum dot layer, the physical treatment including both thermal treatment and plasma processing.

18 Claims, 10 Drawing Sheets

(56) References Cited

U.S. PATENT DOCUMENTS

| | | | |
|---|---|---|---|
| 8,574,685 B1* | 11/2013 | Lewis et al. | 427/472 |
| 2009/0087546 A1* | 4/2009 | Ilzumi et al. | 427/66 |
| 2009/0152664 A1* | 6/2009 | Klem et al. | 257/440 |
| 2010/0090195 A1 | 4/2010 | Parsapour | |

OTHER PUBLICATIONS

*Solar Energy Materials and Solar Cells*, Gunes et al., vol. 91, Issue 5, Mar. 6, 2007, pp. 420-423.

*Low-temperature nanocrystal unification through rotations and relaxations probed by in situ transmission electron microscopy*, Nano Letters, Nov. 8, 2008 (11):3959-63, Epub Sep. 25, 2008.

\* cited by examiner

QUANTUM DOT OPTOELECTRONIC DEVICE AND METHODS THERFOR

BACKGROUND OF THE INVENTION

The field of the invention relates to quantum dot semiconductors. Semiconductor quantum dots (QD) have attracted much attention due to their unique physical, chemical, electrical and optical properties. Much of the interest in optical and electrical characteristics stems from size-dependent properties owing to quantum confinement of charge carriers. This often results in the ability to "tune" the optical spectrum and specifically, both the light absorption and emission responses through changing the size of the QD.

SUMMARY OF THE INVENTION

Disclosed is an optoelectronic device comprising: a quantum dot layer including plurality of quantum dots, wherein the quantum dot layer is formed by removing an organic capping layer of the quantum dots by a physical surface treatment including both thermal treatment and plasma processing.

Also disclosed is a method for constructing an optoelectronic device, the method comprising: forming a quantum dot layer on a substrate including at least one electronically conductive layer, including a plurality of quantum dots which have organic capping layers; and removing organic capping layers from the quantum dots of the quantum dot layer by physically treating the quantum dot layer, the physical treatment including both thermal treatment and plasma processing.

DETAILED DESCRIPTION OF THE INVENTION

Figure 1A:
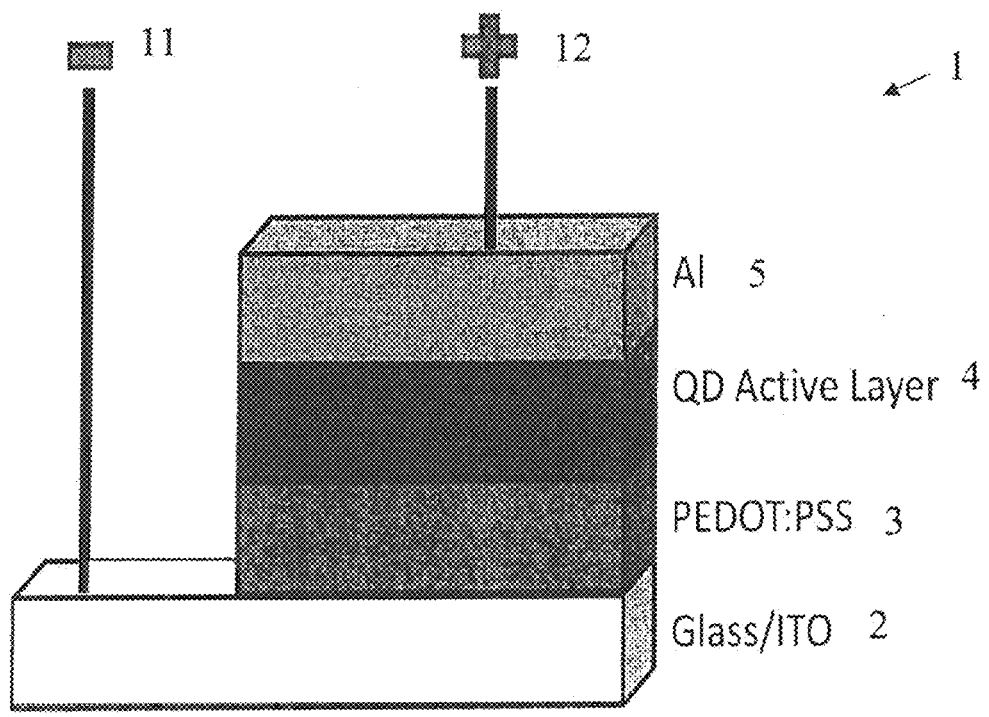
FIG. 1A depicts a general schematic of a QD device.

It is to be understood that the figures and descriptions of the present invention have been simplified to illustrate elements that are relevant for a clear understanding of the present invention, while eliminating, for purposes of clarity, many other elements which are conventional in this art. Non-limiting examples of quantum dot optoelectronic devices, applications, methods and elements thereof are described in U.S. Pat. Nos. 5,889,288; 5,923,046; 5,963,571; 6,281,519; 6,239,449; 7,282,732; 7,358,525; 7,791,157; and 7,829,880, the entirety of each of which are incorporated by reference herein. Further non-limiting examples of quantum dot optoelectronic devices, applications, methods and elements thereof are described in *IV-VI Nanocrystal-polymer solar cells* Karolina P. Fritz, Scrap Guenes et al. Journal of Photochemistry and Photobiology A-chemistry—J PHOTOCHEM PHOTOBIOL A-CHEM, vol. 195, no. 1, pp. 39-46, 2008; *Solar Energy Materials and Solar Cells*, Gunes et al., Volume 91, Issue 5, 6 Mar. 2007, Pages 420-423; and *Low-temperature nanocrystal unification through rotations and relaxations probed by in situ transmission electron microscopy*, Nano Lett. 2008 Nov. 8(11):3959-63, Epub 2008 Sep. 25, the entirety of each of which are incorporated by reference herein. Those of ordinary skill in the art will recognize that other elements are desirable for implementing the present invention. However, because such elements are well known in the art, and because they do not facilitate a better understanding of the present invention, a discussion of such elements is not provided herein.

The use of the terms "a", "an", "at least one", "one or more", and similar terms indicate one of a feature or element as well as more than one of a feature. The use of the term "the" to refer to the feature does not imply only one of the feature and element.

When an ordinal number (such as "first", "second", "third", and so on) is used as an adjective before a term, that ordinal number is used (unless expressly or clearly specified otherwise) merely to indicate a particular feature, such as to distinguish that particular feature from another feature that is described by the same term or by a similar term.

When a single device, article or other product is described herein, more than one device/article (whether or not they cooperate) may alternatively be used in place of the single device/article that is described. Accordingly, the functionality that is described as being possessed by a device may alternatively be possessed by more than one device/article (whether or not they cooperate). Similarly, where more than one device, article or other product is described herein (whether or not they cooperate), a single device/article may alternatively be used in place of the more than one device or article that is described. Accordingly, the various functionality that is described as being possessed by more than one device or article may alternatively be possessed by a single device/article.

The functionality and/or the features of a single device that is described may be alternatively embodied by one or more other devices which are described but are not explicitly described as having such functionality/features. Thus, other embodiments need not include the described device itself, but rather can include the one or more other devices which would, in those other embodiments, have such functionality/features.

The present invention will now be described in detail on the basis of exemplary embodiments.

Disclosed are optoelectronic devices and methods for fabricating quantum dot (QD) optoelectronic devices, where the active layer, i.e. the quantum dot layer within the device, is modified in an effort to enhance the optoelectronic characteristics of the device. While embodiments comprising quantum dot photodetectors (QDPD) are disclosed; the methods and devices can also apply to and include quantum dot devices including, for example, quantum dot solar cells (QDSC) and quantum dot light emitting devices (QD-LED). QDs properties are contemplated for applications in optoelectronics, including as active layers in planar solar cells and photodetectors, as well as for use in electroluminescent devices.

FIG. 1A depicts a general schematic of an exemplary QDPD device 1. In this embodiment, the QDPD 1 includes, a substrate including at least one transparent/translucent electrical conducting layer 2, a planarizing layer 3 shown as a PEDOT: PSS layer, at least one layer 4 of quantum dots (shown with the QD's capping layers removed), and at least one electrical conducting layer 5. As shown, the electrical conducting layer 2 acts as an anode, and the electrical conducting layer 5 acts as a cathode.

Nanostructured photovoltaics exemplify the novel trend in photovoltaics technology research and development, the so-called "Third Generation". This generation of photovoltaics includes technologies utilizing nanomaterials, polymers, and organic molecules to engineer efficient junctions, provide self-assembly, and form ultra thin films. Third Generation photovoltaics afford significant opportunities to achieve low cost, flexibility, high efficiency; and both small and large area implementation. Nanostructured photovoltaics encompass a wide range of technologies including, but not limited to, intermediate bandgap, quantum dot composites, small molecule and polymer organic, and radial junction.

Exemplary advantages of quantum dot photovoltaics include spectral tunability, high efficiency through multiple carrier generation (resulting in enhanced photocurrent), low cost, solution processability, fast device response time, high responsivity, and relative ease of fabrication.

An example of a quantum dot photovoltaic device entails a quantum dot photodetector operating in the photoconductive mode, similar to a conventional photodiode. In this device, the active layer 4, i.e. the quantum dot layer, is typically sandwiched between two electrodes 2,5, with one electrode being optically transparent. The architecture may also utilize charge injection and charge transport layers (not shown) within the device, typically embedded between the active layer and the electrodes. Illumination of the device 1 with light having a specific wavelength range results in generation of electron-hole pairs (excitons) within the active layer 4. Once generated, the excitons may diffuse through the active layer 4 and arrive at an interface where the electrons and the holes can be separated. Following charge separation, the charge carriers are collected at respective electrodes 2,5.

A negative bias voltage is applied through the electrodes. This results in faster collection of charge carriers, and hence, an increase in the response time of the photodetector.

Figure 1B:
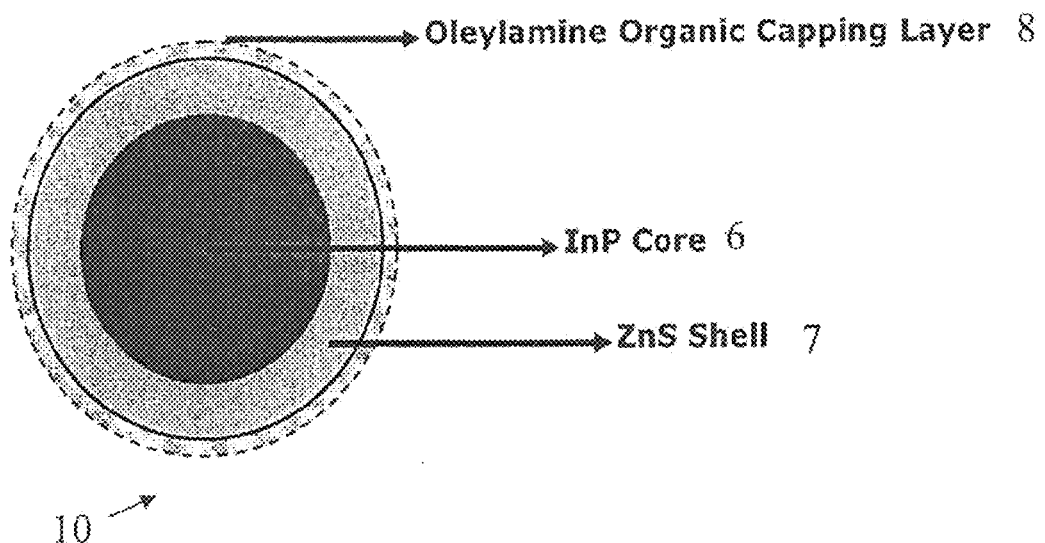
FIG. 1B illustrates a structure of a single quantum dot.

FIG. 1B illustrates the structure of a single quantum dot 10 without the capping layer 8 removed.

Colloidal quantum dot compositions have an active inorganic core 6, for example, InP core 6 shrouded by an organic ligand capping layer 8 (e.g., oleylamine), or, as shown in the FIG. 1B, an active inorganic core 6 encased by an inorganic shell 7, for example ZnS shell 7, which is also shrouded by an organic ligand capping layer 8 (core-shell structure). The inorganic core 6 is responsible for absorption of light following photoexcitation. In general, core-shell structures possess increased stability due to elimination of surface defects by the shell moiety. The organic capping layer 8 assists in dispersability of the QD composition in various solvents and results in kinetic stabilization of the QD dispersion. Nevertheless, individual quantum dots 10 within a formed active layer 4 are typically spaced far apart due to the presence of the organic ligands. In addition, the ligands exhibit electrically insulating characteristics. As such, the organic capping layer or shell 8 can introduce large barrier to charge diffusion and transfer in solid state systems such as QDPDs.

Previous efforts have involved removal of highly insulating organic ligands through exchanging the ligands with less insulating organic ligands, e.g. short-carbon chain ligands, either prior to or following the formation of the QD layer. However, these methods have resulted in either degradation of the quantum dots due to the exchange procedure or formation of large cracks within the active layer. Both of these scenarios may cause poor device characteristics.

Other methods have included removal of the organic capping layer and morphological modification through high temperature thermal treatment (annealing), without utilizing any other physical surface treatment. However, removal of ligands through high temperature annealing has resulted in fusion of QDs into single crystals and loss of size-dependent properties.

Disclosed are methods and devices produced thereby by that remove the organic ligands 8 and, among other exemplary advantages, exhibit improved active layer 4 morphology. Active layer 4 formation is performed by spin coating a dispersion of quantum dots 10 onto the substrate. The surface of the as-coated layer typically exhibits non-uniformities and overall excessive surface roughness prior to and following ligand removal. Active layer 4 modification is achieved by a process comprising:
1. Removal of the organic capping layer 8 surrounding individual QDs 10 at the surface and/or within the active layer 4 through utilization of a low power density plasma; and
2. low-temperature thermal treatment (annealing) of the active layer 4 to achieve improvement in layer morphology and topography.

The aforementioned steps, which can be conducted consecutively or simultaneously, result in removal of the insulating layer between individual quantum morphology and surface roughness, and hence, a reduction in series resistance within the device which improves overall device performance.

The device 1 incorporating the above-mentioned modifications exhibits, among other advantages, a cumulative decrease of at least ca 20% in surface roughness and a site specific decrease in surface roughness up to 60%. The fabrication method for the device 1 follows the one for a standard device, combined with incorporation of the aforementioned steps. In the embodiments described herein, after deposition of the QD layer 4 onto an electrically conductive substrate 2 from a QD dispersion, QD layer is subjected to low energy density plasma treatment, which results in removal or organic ligands 8 from QDs 10, followed by low-temperature annealing of the QD layer 4, which results in, among other advantages, improvement in overall surface morphology. Both steps can be performed prior to deposition of additional charge injection layers (not shown) and top electrode 5; however, the thermal treatment may also be performed following the completion of device 1 fabrication. Elimination of the electrically insulating organic ligand layer 8 via plasma processing in conjunction with thermal treatment for, among other things, improvement in layer morphology, is expected to result in improved carrier diffusion and ultimately, better charge transfer and overall charge collection efficiency within the device 2. The modification and the methods of implementation described herein are applicable to a wide range of quantum dots 10, including size-dependent or composition-dependent QDs of varying sizes and compositions, core, core-shell, alloyed core, and alloyed core-shell quantum dots. Exemplary composition-dependent QDs include Si, Ge, GaAs, CdS, ZnS, ZnSe, CdSe, InP, GaP, InN, GaN, InAs, PbS, PbSe, ZnO, CdSSe, CdSe/ZnS, InP/ZnS, and CdSSe/ZnS. In various embodiments described herein, InP/ZnS core-shell quantum dots 10 are used to form the device's active layer.

The organic capping layer 8 surrounding the quantum dots 10 provides a highly electrically insulating environment within the active layer matrix and at the interface of the active layer 4 with the charge collecting electrode 2. In addition, post-deposition films of the active layer 4 typically suffer from non-uniformities including defects, dislocations, trenches and overall excessive surface roughness before and after capping layer removal. These characteristics result in relatively poor transfer of charges between the individual QDs 10 and also between the QDs 10 and the electrode 2, high series resistance, and ultimately, lower efficiency within the device 1. Removal of the capping layer 8 via plasma processing in conjunction with thermal treatment results in reduction of surface roughness, enhanced charge diffusion and charge collection, and can result in reduction in spacing between individual quantum dots 10. The ligand removal mechanism may involve disintegration of the organic molecules that form the capping layer 8 through reaction with and/or collision of reactive oxygen or argon species (atoms, radicals, excited ions, etc.). Low temperature thermal treatment instigates mobility of quantum dots 10, either within the layer 4 or on the surface 5, which may result in quasi-ordering of QDs and partial removal of defects.

Accordingly, disclosed is a method and device 1 fabricated thereby for removal of the organic capping layer 8 from the quantum dots 10 and, among other things, enhancement of the active layer 4 morphology. In one embodiment, the capping layer 8 removal and active layer 4 morphology enhancement are achieved through utilization of low-energy density argon or oxygen plasma in conjunction with low temperature thermal treatment of the active layer 4, following the deposition of the active quantum dot layer 4 from dispersion. The thermal treatment can be performed in manners comprising:
1. Annealing of the active layer 4 during plasma processing by heating the substrate in a plasma chamber, prior to deposition of the cathode 5.
2. Annealing of the active layer 4 immediately following plasma processing in the plasma chamber under low pressure, prior to deposition of the cathode 5.
3. Annealing of the active layer 4 immediately after the plasma processing, outside the plasma chamber and prior to deposition of the cathode 5, including in an inert atmosphere environment.
4. Annealing of the active layer 4 immediately after the plasma processing, outside the plasma chamber and following deposition of the cathode 5, including in an inert atmosphere environment.

The embodiments disclosed herein are described in the context of an exemplary QDPD 1, the fabrication of which is described as in the exemplary flow charts in FIGS. 5A-5E.

Fabrication of the Standard Device

Figure 5A:
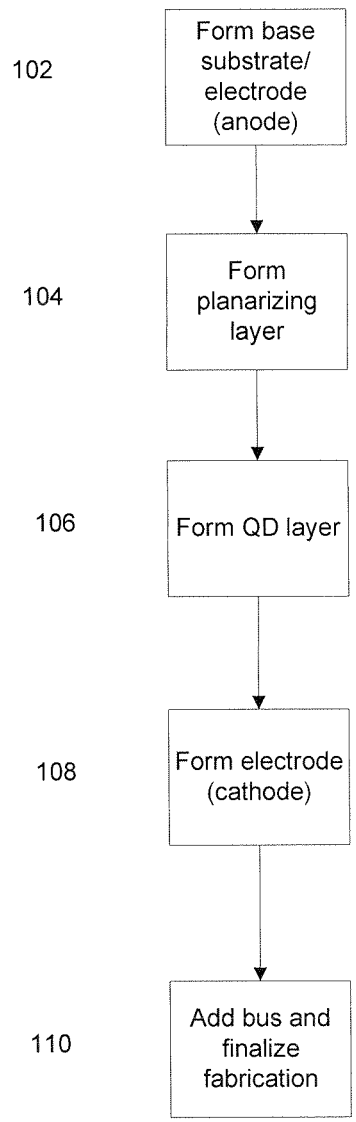
FIGS. 5A-5E are Block diagrams for exemplary embodiments of fabricating exemplary QD devices.

As shown at FIG. 5A, at block 102, a base substrate including at least one electrode layer 2 is formed. A previously cleaned ITO-coated glass substrate 2 (e.g., from Delta Technologies) with surface resistance of 4-100 ohms/square, for example ~70 ohms/square, is baked at 150° C. for 1-2 hours, for example 1.5 hours, and cooled to room temperature.

At Block 104, a planarizing layer 3 is formed. A positive photoresist (e.g., PR-1000, from Futurrex, Inc.) is deposited on the surface of the ITO via spin coating to afford a ~1 micron-thick layer; the planarizing layer 3 is baked at 100° C. for 10 minutes, cooled to room temperature and the substrate inserted into the mask aligner (TAMARAC). A pattern with ~0.4 cm$^2$ area is formed through first exposure to UV radiation and second development in a basic solution (Futurrex RD-1) and third rinsing with purified water.

The resultant substrate is then air-dried and hard-baked at 150° C. for 30 minutes, following which it is cooled to room temperature and inserted in an ITO etch bath containing HCl:H$_2$O:HNO3 (4:2:1 ratio by volume) to remove ITO from areas not masked by the photoresist layer. After rinsing with water and drying with pressurized air, the photoresist layer (mask layer) is removed from the ITO/glass substrate using a remover solution (Futurrex RR-4) with agitation followed by water rinse to afford a rectangular pattern of ITO ~0.4 cm$^2$ on top of the glass substrate. The ITO-patterned substrate is then subjected to UV-Ozone cleaning procedure to remove residual organics, and increase the surface free energy and the work function of the ITO layer. A ca. 30 nm layer of PEDOT:PSS from a water dispersion (Clevios P AI 4083, 1.75 wt % from H.C. Stark) is formed via spin-coating of the aforementioned patterned substrate and baked at 200° C. for 10 minutes to remove residual water.

At Block 106, a quantum dot layer 4 is formed. A quantum dot layer 4 is formed on a substrate, the QD layer 4 including a plurality of quantum dots 10 which have capping layers 8. Following cooling to room temperature, a dispersion of InP/ZnS quantum dots 10 capped with oleylamine in chloroform (ca. 6 nm QD average diameter, from NN Labs, Fayetteville, Ark.) at 1-50 mg/ml total QD content, for example 20 mg/ml total QD content, is dispensed onto the substrate. The substrate is spin coated to afford a ca. 70 nm-thick QD layer. A small area of the ITO/PEDOT/QD adjacent to the edge of the substrate is wiped cleaned of both the PEDOT and the QDs to expose the bare ITO for future electrical connection. The substrate is then masked in such manner to afford a ca. 0.1 cm$^2$ active area following metal cathode deposition.

At Block 108, at least one electrode layer, a cathode layer 5, is formed. The substrate is placed in an e-beam evaporator where a 100 nm thick layer of aluminum (Al) cathode material is deposited on active layer 4 at a rate of 0.2 nm/s and an operating vacuum level of 1.0E-6 Torr. Following the cathode deposition, the substrate is removed from the evaporator and, as shown at Block 110, two parallel conductive bus bars 11, 12 are formed on either electrode (ITO and Al) to facilitate electrical contact, whereupon the device is finalized or goes on for further steps.

Fabrication of Exemplary Device 1

Figure 5B:
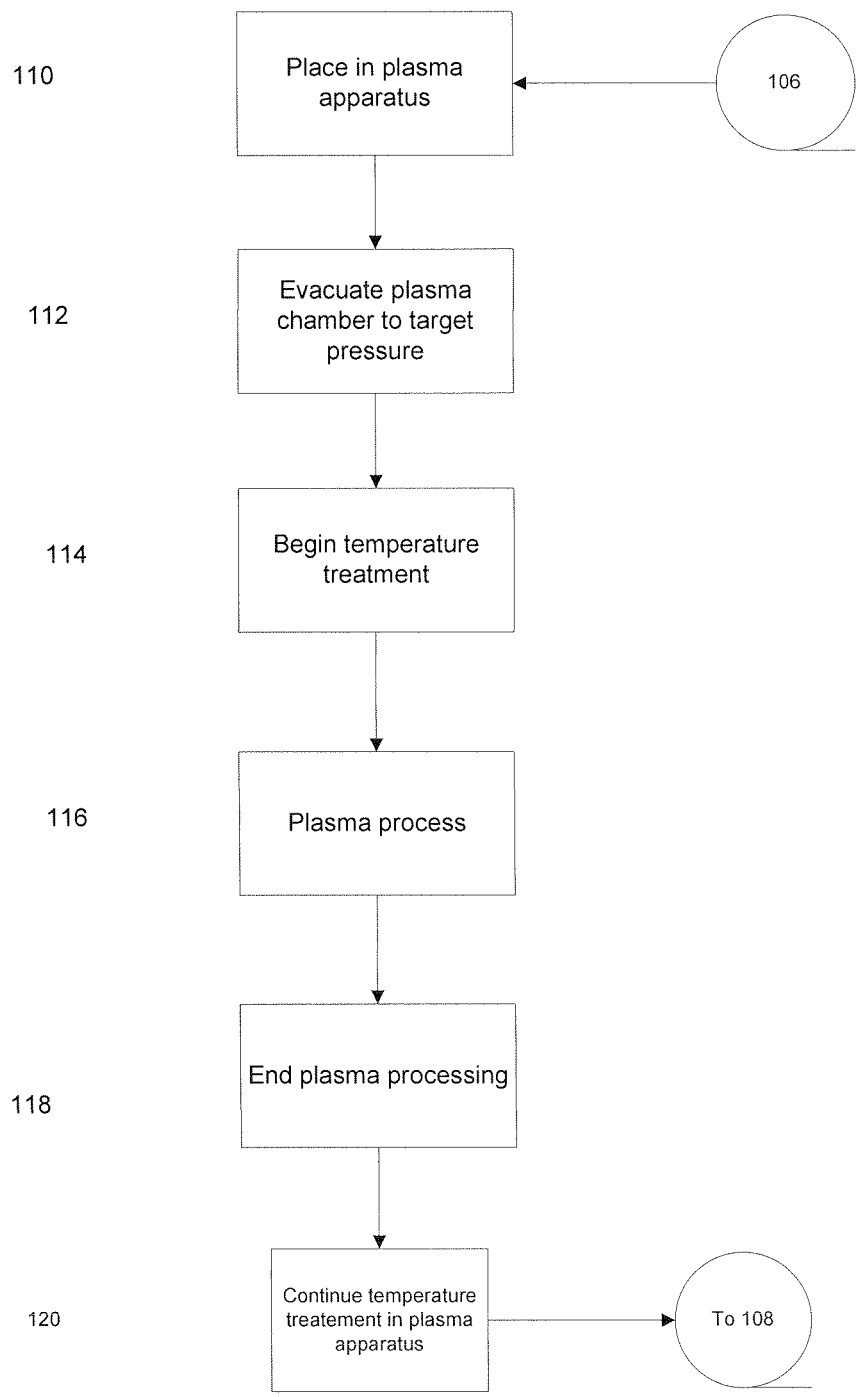

As shown at FIG. 5B, in one embodiment, fabrication of the modified QDPD device 1 includes the following steps prior to cathode deposition 108 and contact formation on the standard device (described above). Following the deposition of the QD layer 4 at Block 106 and removal of a portion of layers to expose the bare ITO for electrical connection, at Block 107 the layered substrate is placed in a plasma apparatus such as a parallel-plate RF plasma apparatus' chamber. At Block 112, the chamber is evacuated down to a pressure of ~5 mTorr.

At Block 114 just prior to and during plasma processing, the substrate is heated to 40-90 degrees Celsius, for example 70-80 degrees Celsius, and maintained at temperature. The substrate can be heated from about 300 to about 0 seconds prior to plasma processing, for example, at about 20 seconds prior to plasma processing, and during plasma processing.

At Block 116 the plasma processing is carried out. Once the temperature is reached, oxygen or argon gas is introduced into the chamber through a mass flow controller at a rate of 20-50 sccm, for example 25 sccm, and the chamber pressure is stabilized to 100-200 mTorr, for example 150 mTorr. A power density in the range of 0.6-3 mW/cm$^3$, for example 1.4 mW/cm$^3$, is applied to generate the oxygen or argon plasma. The treatment time is 60-240 seconds, for example 90 seconds. After this, at block 118 the plasma processing is stopped and ended. At Block 120, thermal treatment is continued for an additional 1-50 minutes, for example 28 minutes, post plasma treatment.

Following the plasma and thermal treatments, the procedure for the standard device 1 is again followed to afford the finalized modified device. At block 108, at least one cathode layer 5 is formed. The substrate is placed in an e-beam evaporator where a 100 nm thick layer of aluminum (Al) cathode material is deposited on active layer 4 at a rate of 0.2 nm/s and an operating vacuum level of 1.0E-6 Torr. As shown at block 110, following the cathode deposition, the substrate is removed from the evaporator and two parallel conductive bus bars 11, 12 are formed on either electrode (ITO and Al) to facilitate electrical contact, whereupon the device is finalized or goes on for further steps.

Fabrication of Exemplary Device 2

Figure 5C:
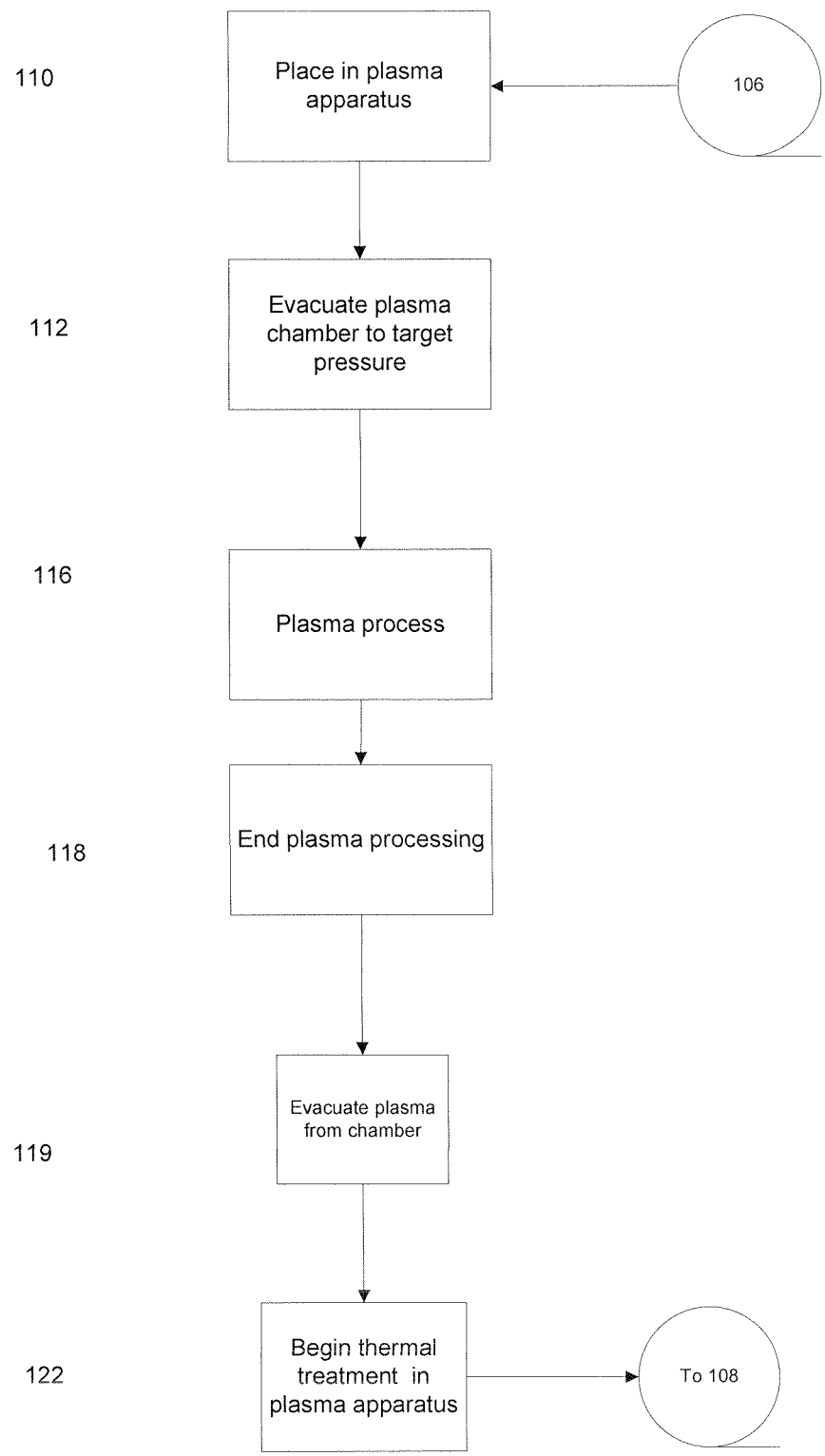

As shown at FIG. 5C, in another embodiment, fabrication of the modified QDPD device 1 includes the following steps prior to cathode deposition 108 and contact formation on the standard device. Following the deposition of the QD layer 4 as shown at Block 106 and removal of a portion of layers to expose the bare ITO for electrical connection, at Block 107 the layered substrate is placed in a plasma apparatus such as a parallel-plate RF plasma apparatus' chamber. At Block 112 the chamber is evacuated to a target pressure, for example, the chamber can be evacuated down to a pressure of ~5 mTorr.

At Block 116 the plasma processing is carried out. Oxygen or argon gas is introduced into the chamber through a mass flow controller at a rate of 20-50 sccm, for example 25 sccm, and the chamber pressure is stabilized to 100-200 mTorr, for example 150 mTorr. A power density in the range of 0.6-3 mW/cm$^3$, for example 1.4 mW/cm$^3$, is applied to generate the oxygen or argon plasma. The treatment time is 60-240 seconds, for example 90 seconds. After this, at block 118 the plasma processing is stopped and ended.

At block 119, after plasma processing, the chamber is evacuated and the substrate is maintained under low pressure inside the chamber. At Block 122, the substrate is thermally treated in the chamber. The substrate is heated to 40-90 degrees Celsius, for example 70-80 degrees Celsius, and maintained at temperature for 30 minutes. Following the plasma and thermal treatments, the procedure for the standard device 1 is again followed to afford the finalized modified device.

At block 108, at least one cathode layer 5 is formed. The substrate is placed in an e-beam evaporator where a 100 nm thick layer of aluminum (Al) cathode material is deposited on active layer 4 at a rate of 0.2 nm/s and an operating vacuum level of 1.0E-6 Torr. As shown at block 110, following the cathode deposition, the substrate is removed from the evaporator and two parallel conductive bus bars 11, 12 are formed on either electrode (ITO and Al) to facilitate electrical contact, whereupon the device is finalized or goes on for further steps.

Fabrication of Exemplary Device 3

Figure 5D:
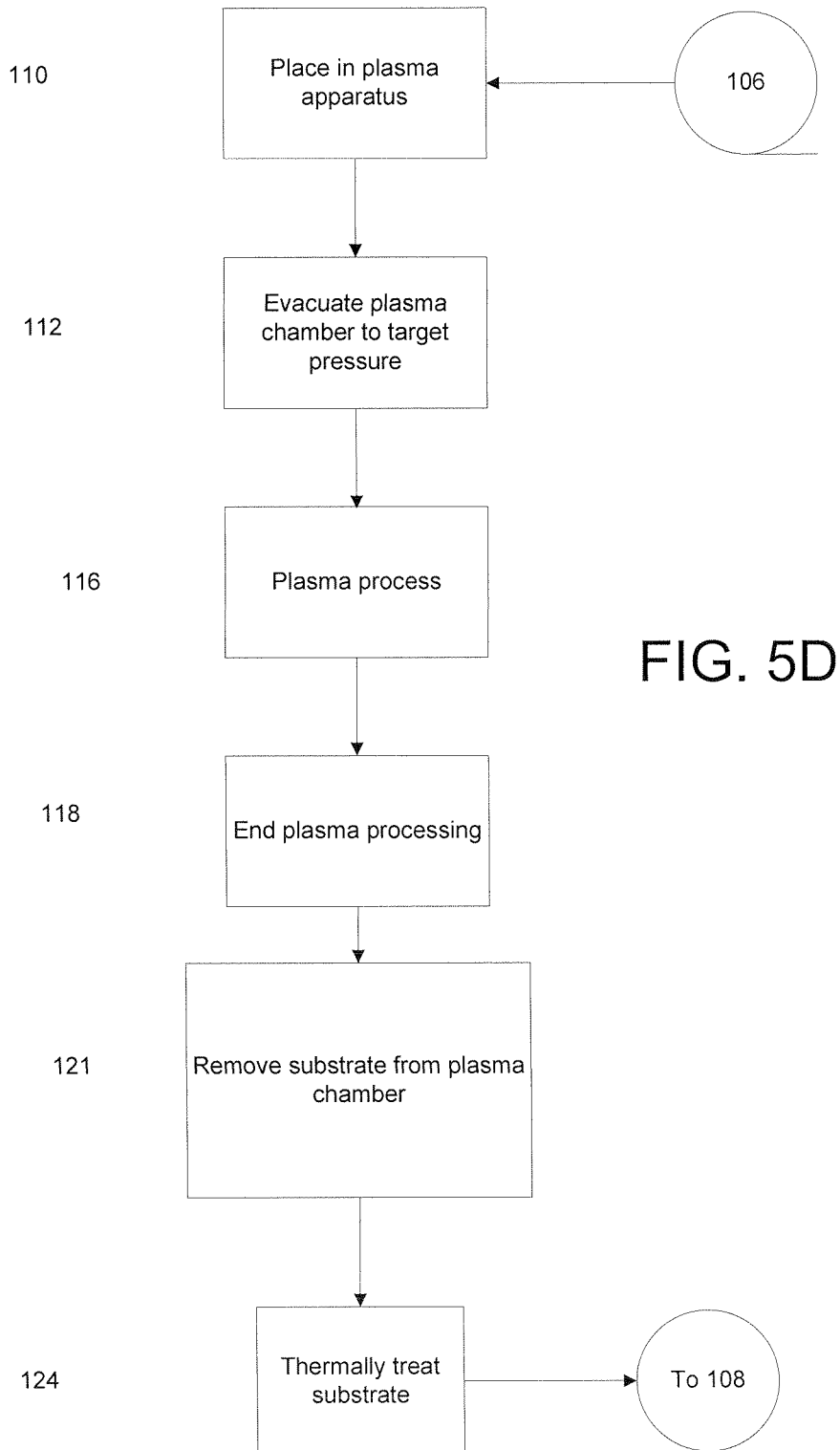

As shown at FIG. 5D, in another embodiment, fabrication of the modified QDPD device 1 includes the following steps prior to cathode deposition 108 and contact formation on the standard device. Following the deposition of the QD layer 4 as shown at Block 106 and removal of a portion of layers to expose the bare ITO for electrical connection, at Block 107 the layered substrate is placed in a plasma apparatus such as a parallel-plate RF plasma apparatus' chamber. At Block 112 the chamber is evacuated to a target pressure, for example, the chamber can be evacuated down to a pressure of ~5 mTorr.

At Block 116 the plasma processing is carried out. Oxygen or argon gas is introduced into the chamber through a mass flow controller at a rate of 20-50 sccm, for example 25 sccm, and the chamber pressure is stabilized to 100-200 mTorr, for example 150 mTorr. A power density in the range of 0.6-3 mW/cm$^3$, for example 1.4 mW/cm$^3$, is applied to generate the oxygen or argon plasma. The treatment time is 60-240 seconds, for example 90 seconds. After this, at block 118 the plasma processing is stopped and ended.

After plasma processing, at Block 124 the substrate is removed from the chamber and moved to a device for thermal treatment. For example, the substrate can be placed in an inert atmosphere glove box. The substrate is heated to 40-90 degrees Celsius, for example 70-80 degrees Celsius, and maintained at temperature for 30 minutes. Following the plasma and thermal treatments, the procedure for the standard device 1 is again followed to afford the finalized modified device, as shown starting at FIG. 5A, Block 108 above.

FIGS. 2A-4B show comparative results in accord with the fabrication of Exemplary Device 3 above.

Figure 2A:
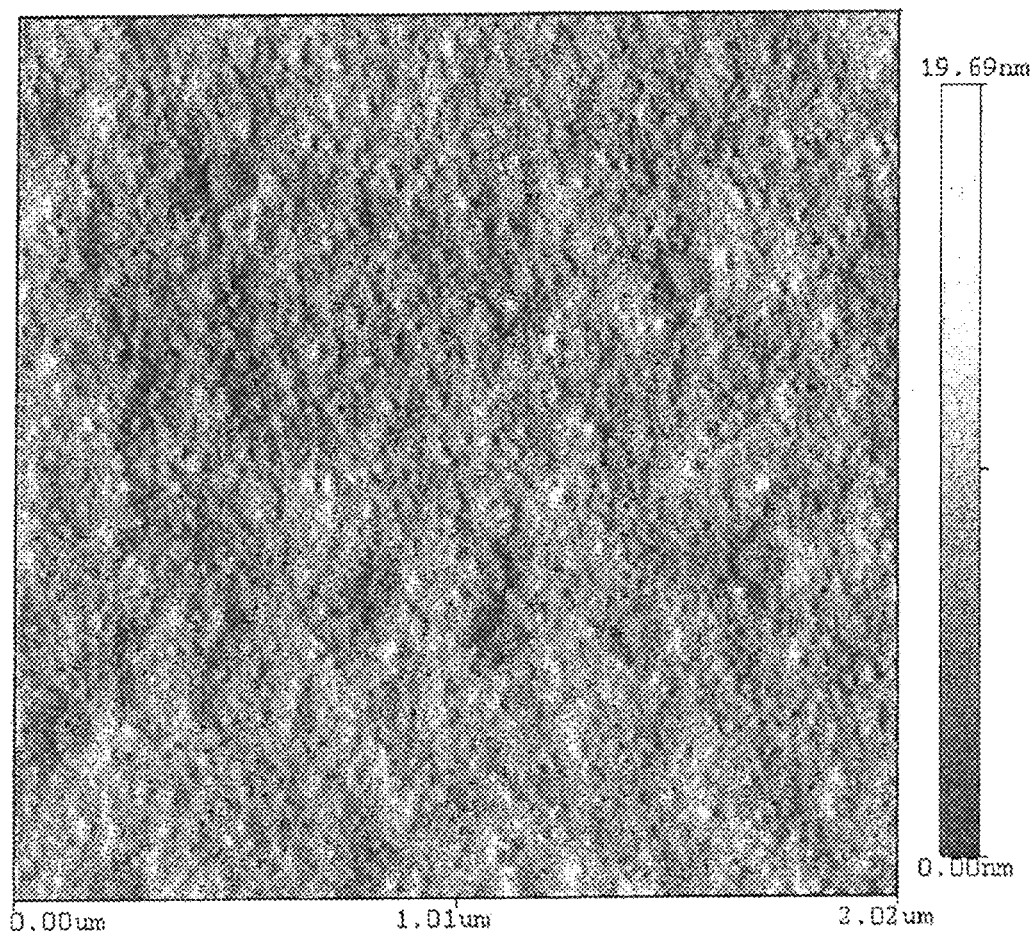
FIG. 2A shows a plan view Atomic Force Microscope (AFM) height image of an active layer of a QD device post plasma treatment and prior to thermal treatment.
Figure 2B:
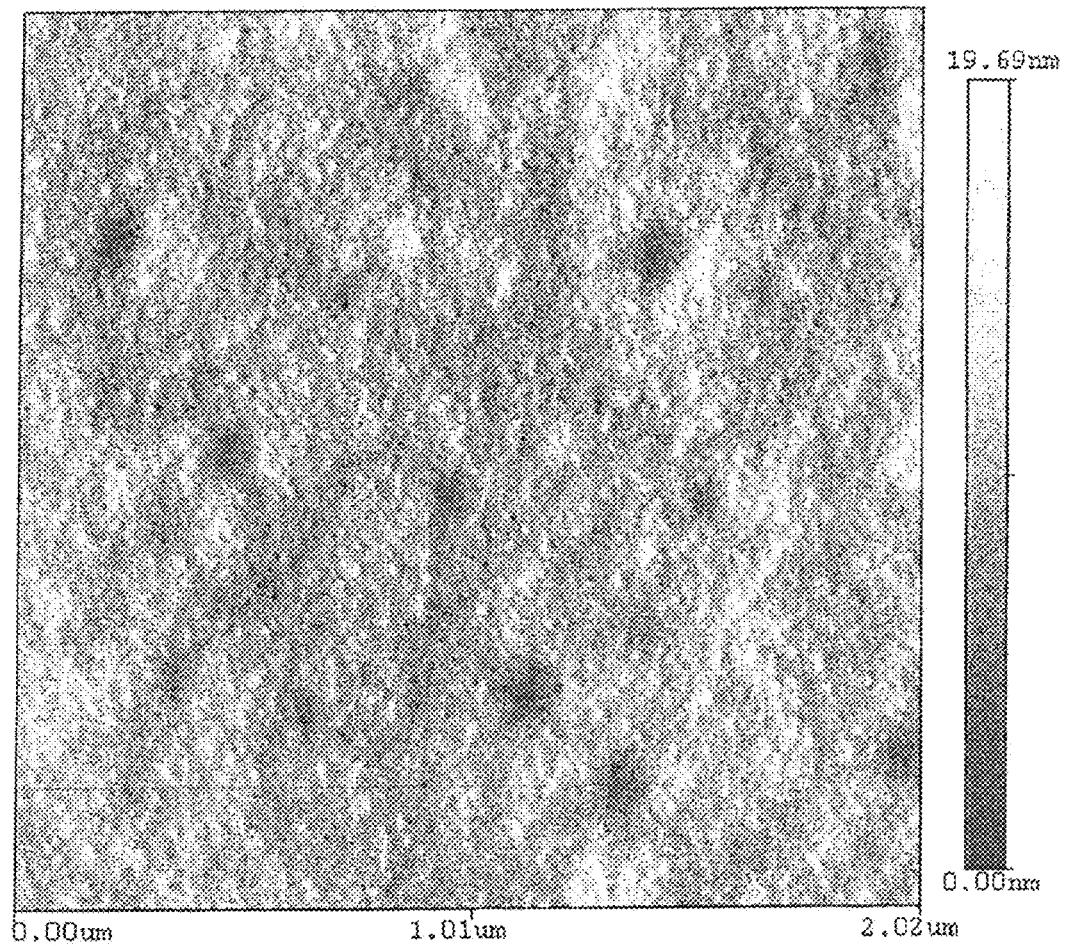
FIG. 2B illustrates a plan view AFM height image of an active layer of a QD device post plasma treatment and thermal treatment.

FIG. 2A exhibits plan view of a 2.02 square micrometer Atomic Force Microscope (AFM) height image of an active layer 4 of a device made in accord with the fabrication of Exemplary Device 3 after plasma treatment 116-118 but prior to thermal treatment 124. FIG. 2B illustrates and AFM height image of the device after both post plasma 116-118 and thermal treatments 124. The image graphically shows via gradient shading a depth of the plan surface from 0.00 nm to 19.69 nm. As can be readily seen, there is a significant decrease in surface roughness of the active layer 4 after both plasma processing 116-118 and thermal treatment 124. Also shown is a decrease in overall site defects.

Figure 3B:
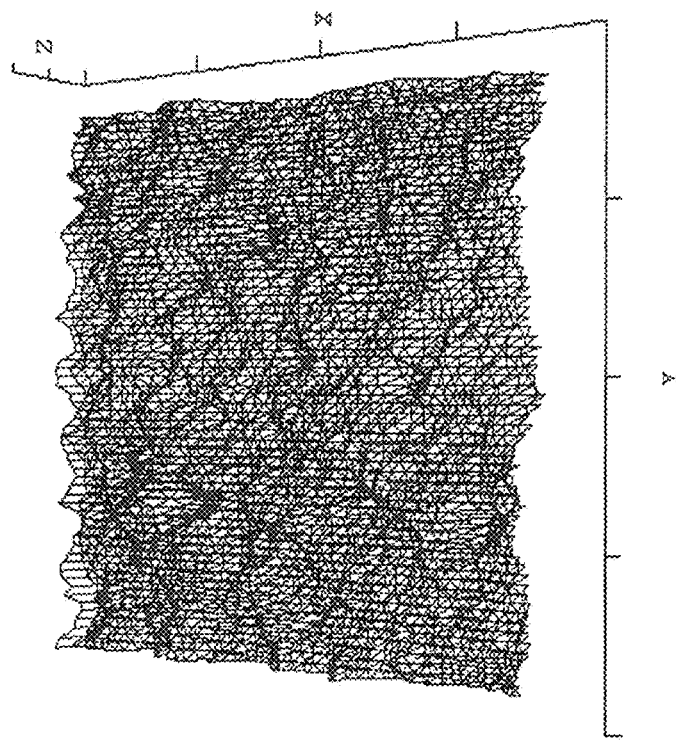
FIG. 3B depicts a perspective view an AFM grid image of an active layer of a QD device post plasma treatment and thermal treatment.
Figure 3A:
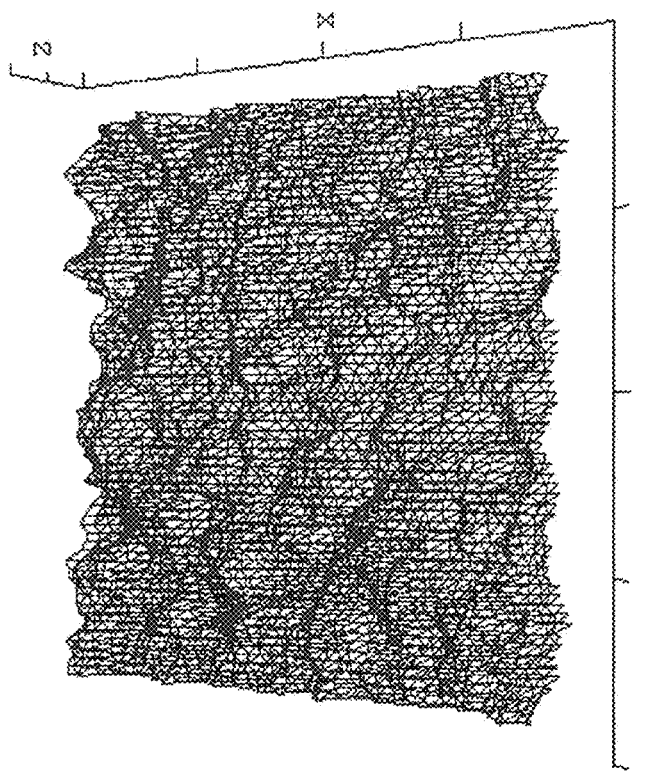
FIG. 3A depicts a perspective view of an AFM grid image of an active layer of a QD device post plasma treatment and prior to thermal treatment.

FIG. 3A depicts the AFM image as a perspective grid image of active layer of device 4 post plasma treatment 116-118 and prior to thermal treatment 124. FIG. 3B depicts an AFM grid image of post plasma 116-118 and thermal treatments 124. Again, as can be readily seen, there is a significant decrease in surface roughness of the active layer 4 after both plasma processing 116-118 and thermal treatment 124, as well as a decrease in overall site defects.

Figure 4A:
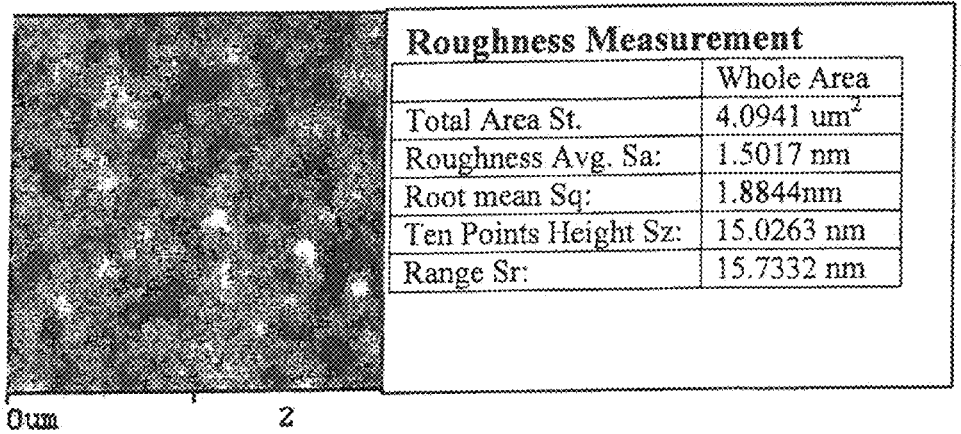
FIG. 4A exhibits surface roughness image and analysis of active layer of device post plasma treatment and prior to thermal treatment.

FIG. 4A exhibits surface roughness analysis of active layer 4 of device 1 post plasma treatment 116-118 and prior to thermal treatment 124, as shown in the following table:

|  | Whole Area |
| --- | --- |
| Total Area St. | 4.091 um$^2$ |
| Roughness Avg. Sa: | 1.5017 nm |
| Root mean Sq: | 1.8844 nm |
| Ten Points Height Sz: | 15.0263 nm |
| Range Sr: | 15.7332 nm |

Figure 4B:
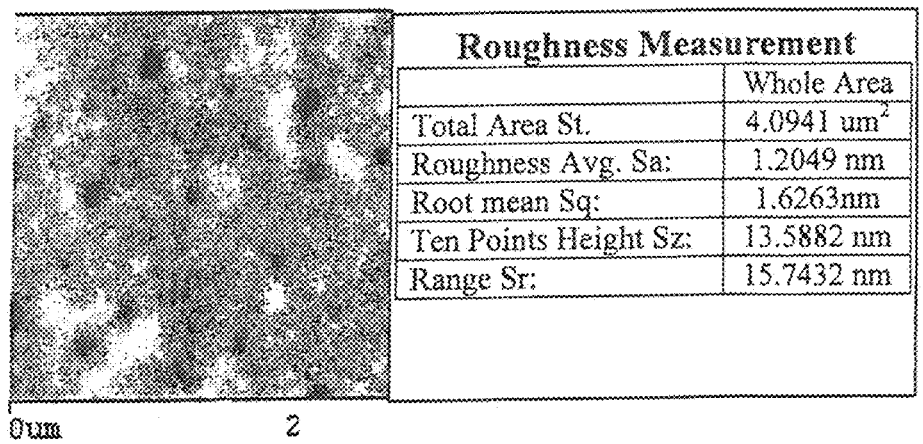
FIG. 4B illustrates surface roughness image and analysis of post plasma treatment and thermal treatment.

FIG. 4B illustrates surface roughness analysis of the active layer 4 of device 1 after the plasma processing 116-118 and thermal treatments 124, as shown in following table:

|  | Whole Area |
| --- | --- |
| Total Area St. | 4.091 um$^2$ |
| Roughness Avg. Sa: | 1.2049 nm |
| Root mean Sq: | 1.6263 nm |
| Ten Points Height Sz: | 13.5882 nm |
| Range Sr: | 15.7432 nm |

As can be seen from the data above, the device incorporating the above-mentioned modifications the layer morphology includes, among other advantages, a cumulative decrease of at least ca 20% in surface roughness and also exhibits a cumulative decrease in surface roughness up to 60%.

Fabrication of Modified Device 4

Figure 5E:
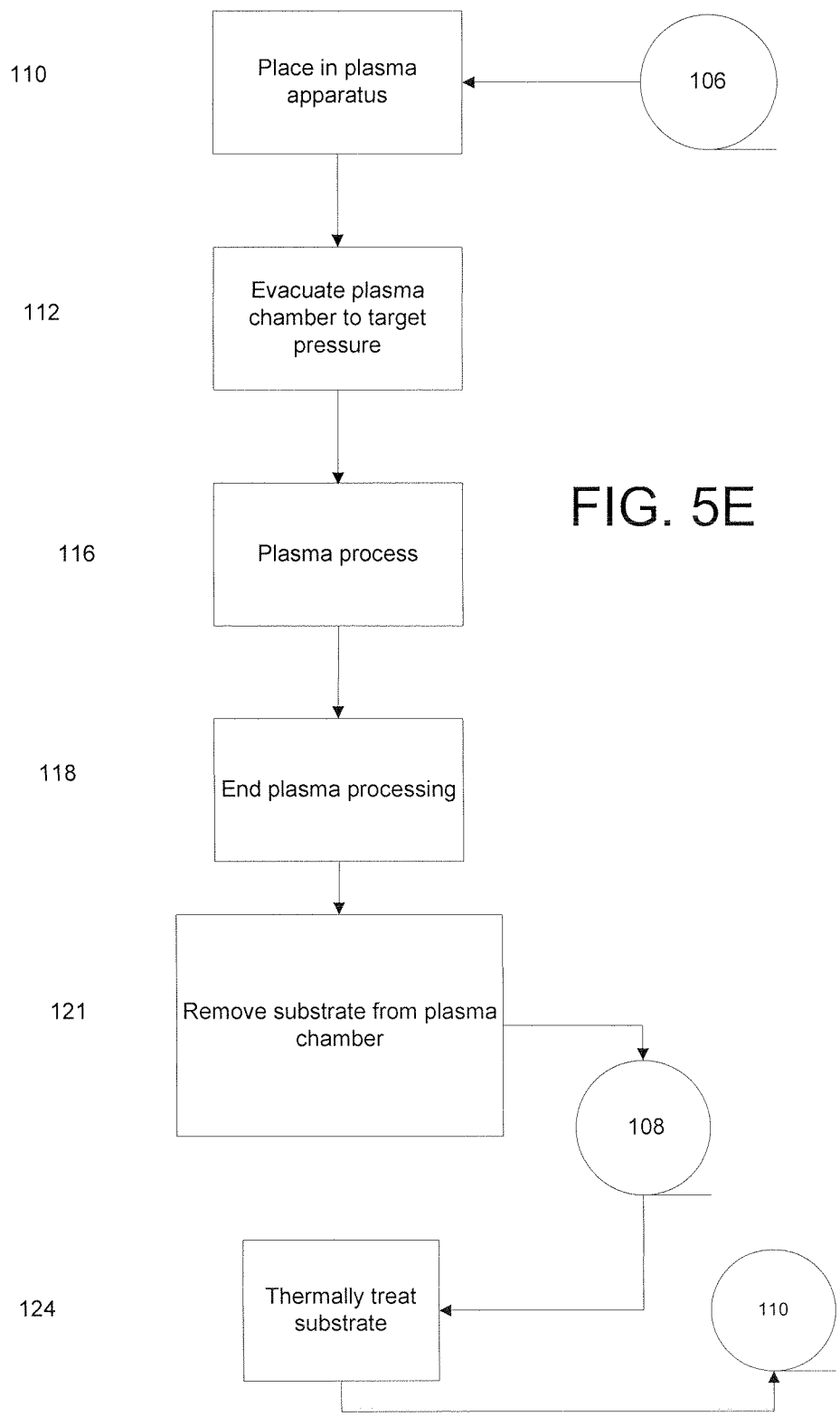

As shown at FIG. 5E, in another embodiment, fabrication of the modified QDPD device 1 can incorporate the following additional steps prior to cathode deposition and contact formation on the standard device. Fabrication of the modified QDPD device 1 includes the following steps prior to cathode deposition 108 and contact formation 110 on the standard device. Following the deposition of the QD layer 4 as shown at Block 106 and removal of a portion of layers to expose the bare ITO for electrical connection. At Block 107 the layered substrate is placed in a plasma apparatus such as a parallel-plate RF plasma apparatus' chamber. At Block 112 the chamber is evacuated to a target pressure, for example, the chamber can be evacuated down to a pressure of ~5 mTorr.

At Block 116 the plasma processing is carried out. Oxygen or argon gas is introduced into the chamber through a mass flow controller at a rate of 20-50 sccm, for example 25 sccm, and the chamber pressure is stabilized to 100-200 mTorr, for example 150 mTorr. A power density in the range of 0.6-3 $mW/cm^3$, for example 1.4 $mW/cm^3$, is applied to generate the oxygen or argon plasma. The treatment time is 60-240 seconds, for example 90 seconds. After this, at block 118 the plasma processing is stopped and ended.

After plasma processing 116-118, the substrate is removed from the chamber, and as shown in Block 108 at least one cathode layer is formed. The substrate is placed in an e-beam evaporator where a 100 nm thick layer of aluminum (Al) cathode material is deposited on active layer at a rate of 0.2 nm/s and an operating vacuum level of 1.0E-6 Torr.

Following the cathode deposition, at Block 124 the substrate is removed from the evaporator and moved to a device for thermal treatment. For example, the substrate can be placed in an inert atmosphere device, such as an inert atmosphere glove box. The substrate is heated to 40-90 degrees Celsius, for example 70-80 degrees Celsius, and maintained at temperature for 30 minutes. The substrate is heated to 40-90 degrees Celsius, for example 70-80 degrees Celsius, and maintained at temperature for 30 minutes. The substrate is then removed from the heat source and, as shown at block 110, the substrate is removed from the box and two parallel conductive bus bars 11, 12 are formed on either electrode (ITO and Al) to facilitate electrical contact, whereupon the device is finalized or goes on for further steps.

Although exemplary embodiments of the present invention and modifications thereof have been described in detail herein, it is to be understood that this invention is not limited to these precise embodiments and modifications, and that other modifications and variations may be effected by one skilled in the art without departing from the spirit and scope of the invention as defined by the appended claims.

What is claimed is:

1. An optoelectronic device comprising:
   a quantum dot layer including a plurality of quantum dots which do not have capping layers, wherein the quantum dot layer is formed by removing an organic capping layer of the quantum dots by a physical surface treatment including both thermal treatment and plasma processing; and
   wherein the quantum dot layer has an improved layer morphology including a cumulative decrease of at least about 20% in surface roughness as compared to a quantum dot layer formed by a physical surface treatment including plasma processing only.

2. The optoelectronic device of claim 1;
   wherein the thermal treatment and the plasma processing are performed at the same time.

3. The optoelectronic device of claim 1;
   wherein the thermal treatment and the plasma processing are performed independently.

4. The optoelectronic device of claim 3;
   wherein the thermal treatment is performed after the plasma processing.

5. The optoelectronic device of claim 1;
   wherein the quantum dot layer has enhanced electrical properties as compared to a quantum dot layer formed by a physical surface treatment including either plasma processing or thermal treatment, but not both, wherein the electrical properties are selected from the group consisting essentially of carrier diffusion, charge transfer, reduced spacing between individual quantum dots, and charge collection.

6. The optoelectronic device of claim 1;
   wherein the improved layer morphology of the quantum dot layer further includes a site specific decrease of at least about 60% in surface roughness as compared to a quantum dot layer formed by a physical surface treatment including plasma processing only.

7. The optoelectronic device of claim 4;
   wherein the thermal treatment is performed after the plasma processing, and wherein the thermal treatment is performed after depositing all the layers of the device.

8. The optoelectronic device of claim 1;
   wherein the thermal treatment is performed after the plasma processing, and wherein the thermal treatment is performed after depositing all the layers of the device.

9. The optoelectronic device of claim 1;
   wherein the quantum dots are selected from the group consisting essentially of size-dependent quantum dots, composition-dependent quantum dots, core-shell quantum dots, alloyed core quantum dots, and alloyed core-shell quantum dots.

10. The optoelectronic device of claim 1;
    wherein the quantum dots are InP/ZnS core-shell quantum dots.

11. The optoelectronic device of claim 1;
    wherein the optoelectronic device is selected from the group consisting of a photovoltaic device, a photodetector, a solar cell, and a light emitting device.

12. The optoelectronic device of claim 1;
    wherein the at least one first electrical conducting layer is an anode electrical conducting layer.

13. The optoelectronic device of claim 1;
    wherein the substrate includes glass.

14. The optoelectronic device of claim 1;
    wherein the at least one second electrical conducting layer is a cathode electrical conducting layer.

15. The optoelectronic device of claim 14;
    wherein the cathode electrical conducting layer includes aluminum.

16. The optoelectronic device of claim 11;
    wherein the optoelectronic device is a photovoltaic device.

17. The optoelectronic device of claim 1;
    wherein the planarizing layer is made of PEDOT:PSS.

18. The optoelectronic device of claim 1, further comprising:
    a substrate including at least one first electric conducting layer;
    a planarizing layer made of organic material; and
    at least one second electric conducting layer;
    wherein the planarizing layer is between the at least first electrical conducting layer and the quantum dot layer.

* * * * *